(12) United States Patent
Chen et al.

(10) Patent No.: US 10,157,862 B1
(45) Date of Patent: Dec. 18, 2018

(54) INTEGRATED FAN-OUT PACKAGE AND METHOD OF FABRICATING THE SAME

(71) Applicant: Taiwan Semiconductor Manufacturing Co., Ltd., Hsinchu (TW)

(72) Inventors: Wei-Yu Chen, Taipei (TW);
Ching-Hua Hsieh, Hsinchu (TW);
Chung-Shi Liu, Hsinchu (TW);
Hsiu-Jen Lin, Hsinchu County (TW);
Chia-Lun Chang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/662,266

(22) Filed: Jul. 27, 2017

(51) Int. Cl.
| | |
|---|---|
| *H01L 23/52* | (2006.01) |
| *H01L 23/00* | (2006.01) |
| *H01L 23/538* | (2006.01) |
| *H01L 23/31* | (2006.01) |
| *H01L 25/10* | (2006.01) |
| *H01L 21/48* | (2006.01) |
| *H01L 21/56* | (2006.01) |

(52) U.S. Cl.
CPC .......... *H01L 23/562* (2013.01); *H01L 21/486* (2013.01); *H01L 21/4853* (2013.01); *H01L 21/4857* (2013.01); *H01L 21/565* (2013.01); *H01L 23/3128* (2013.01); *H01L 23/5383* (2013.01); *H01L 23/5384* (2013.01); *H01L 23/5386* (2013.01); *H01L 23/5389* (2013.01); *H01L 25/105* (2013.01); *H01L 2225/1035* (2013.01); *H01L 2225/1058* (2013.01)

(58) Field of Classification Search
CPC ............ H01L 23/3128; H01L 21/4853; H01L 21/486; H01L 25/105; H01L 21/565; H01L 23/5389; H01L 21/4857; H01L 23/5384; H01L 23/5386; H01L 23/5383; H01L 23/562
USPC ......................................................... 257/780
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |

(Continued)

*Primary Examiner* — Luan C Thai
(74) *Attorney, Agent, or Firm* — JCIPRNET

(57) ABSTRACT

An integrated fan-out package including an integrated circuit component, an insulating encapsulation, a redistribution circuit structure and a plurality of conductive terminals is provided. The insulating encapsulation laterally encapsulates sidewalls of the integrated circuit component. The redistribution circuit structure is disposed on the insulating encapsulation and the integrated circuit component. The redistribution circuit structure is electrically connected to the integrated circuit component and the redistribution circuit structure includes a plurality of ball pads. Each of the conductive terminals includes a conductive ball and a ring-shaped flux structure, wherein each of the conductive balls is disposed on and electrically connected to one of the ball pads. Each of the ring-shaped flux structures is disposed on the redistribution circuit structure. Each of the ring-shaped flux structure is disposed around and in contact with a bottom portion of the conductive ball. A method of fabricating an integrated fan-out package is also provided.

20 Claims, 14 Drawing Sheets

(56) References Cited

U.S. PATENT DOCUMENTS

| | | | |
|---|---|---|---|
| 9,048,233 B2 | 6/2015 | Wu et al. | |
| 9,064,874 B2 | 6/2015 | Edelstein et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2016/0071820 A1* | 3/2016 | Yu | H01L 21/6835 257/737 |
| 2016/0148864 A1* | 5/2016 | Fu | H01L 23/49811 257/692 |
| 2016/0329262 A1* | 11/2016 | Hsiao | H01L 23/50 |

* cited by examiner

INTEGRATED FAN-OUT PACKAGE AND METHOD OF FABRICATING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness. In the integrated fan-out packages including at least one chip that is encapsulated by the molding compound, reliability of electrical connection between the redistribution circuit structure fabricated on the molding compound and the conductive terminals formed on the redistribution circuit structure may deteriorate due to delamination occurring at the interface between conductive layer and dielectric layer in the redistribution circuit structure. How to increase yield rate of the fabrication of integrated fan-out packages is highly concerned.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
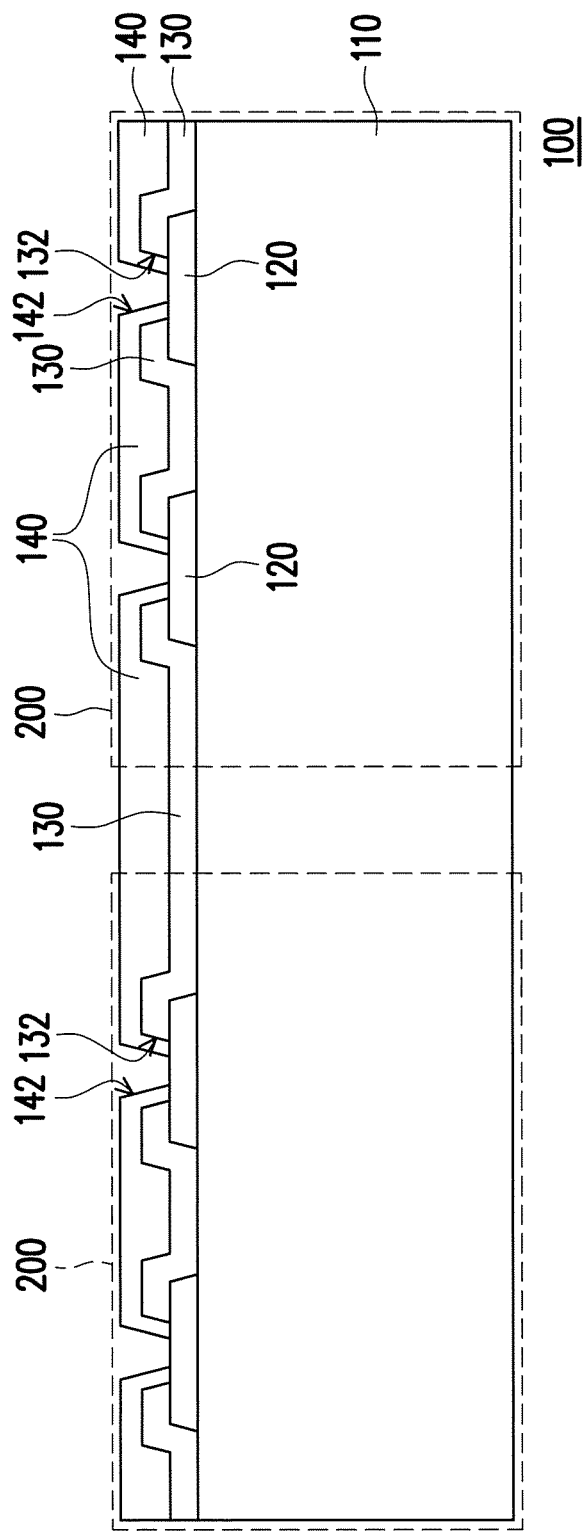
FIGS. 1 through 13 illustrate a process flow for fabricating an integrated fan-out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 13:
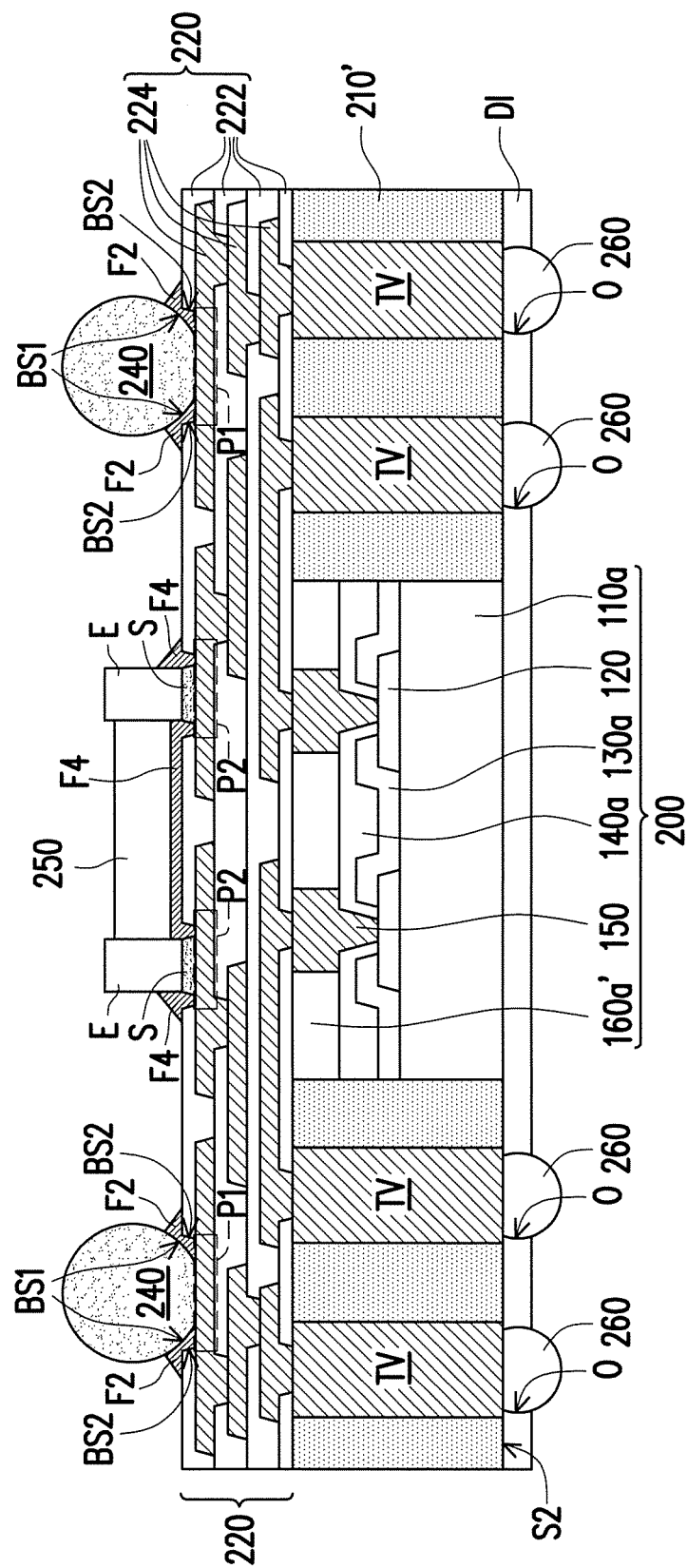
Figure 14:
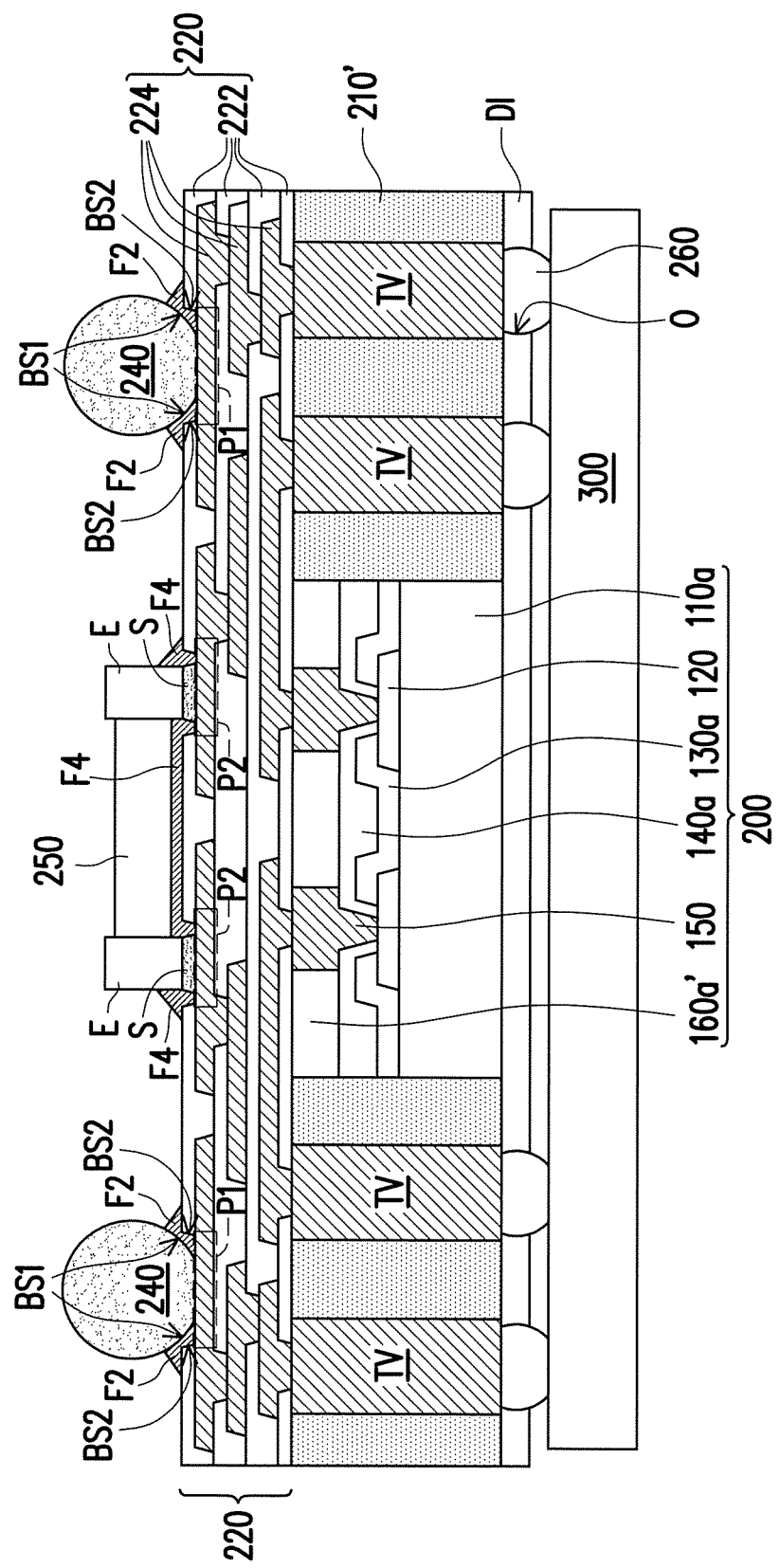
FIG. 14 is a cross-sectional view illustrating a package-on-package (POP) structure in accordance with some embodiments.

FIGS. 1 through 13 illustrate a process flow for fabricating an integrated fan-out package in accordance with some embodiments, and FIG. 14 is a cross-sectional view illustrating a package-on-package (POP) structure in accordance with some embodiments.

Referring to FIG. 1, a wafer 100 including a plurality of dies or integrated circuits 200 which are arranged in an array is provided. Before performing a wafer dicing process on the wafer 100, the integrated circuits 200 of the wafer 100 are physically connected one another. In some embodiments, the wafer 100 includes a semiconductor substrate 110, a plurality of conductive pads 120 formed on the semiconductor substrate 110, and a passivation layer 130. The passivation layer 130 is formed over the substrate 110 and has a plurality of contact openings 132 such that the conductive pads 120 are partially exposed by the contact openings 132 of the passivation layer 130. For example, the semiconductor substrate 110 may be a silicon substrate including active components (e.g., transistors or the like) and passive components (e.g., resistors, capacitors, inductors or the like) formed therein; the conductive pads 120 may be aluminum pads, copper pads or other suitable metal pads; and the passivation layer 130 may be a silicon oxide layer, a silicon nitride layer, a silicon oxy-nitride layer or a dielectric layer formed by other suitable dielectric materials.

As shown in FIG. 1, in some embodiments, the wafer 100 may optionally include a post-passivation layer 140 formed over the passivation layer 130. The post-passivation layer 140 covers the passivation layer 130 and has a plurality of contact openings 142. The conductive pads 120 partially exposed by the contact openings 132 of the passivation 130 are partially exposed by the contact openings 142 of the post passivation layer 140. For example, the post-passivation layer 140 may be a polyimide (PI) layer, a polybenzoxazole (PBO) layer, or a dielectric layer made from other suitable dielectric polymers.

Figure 2:
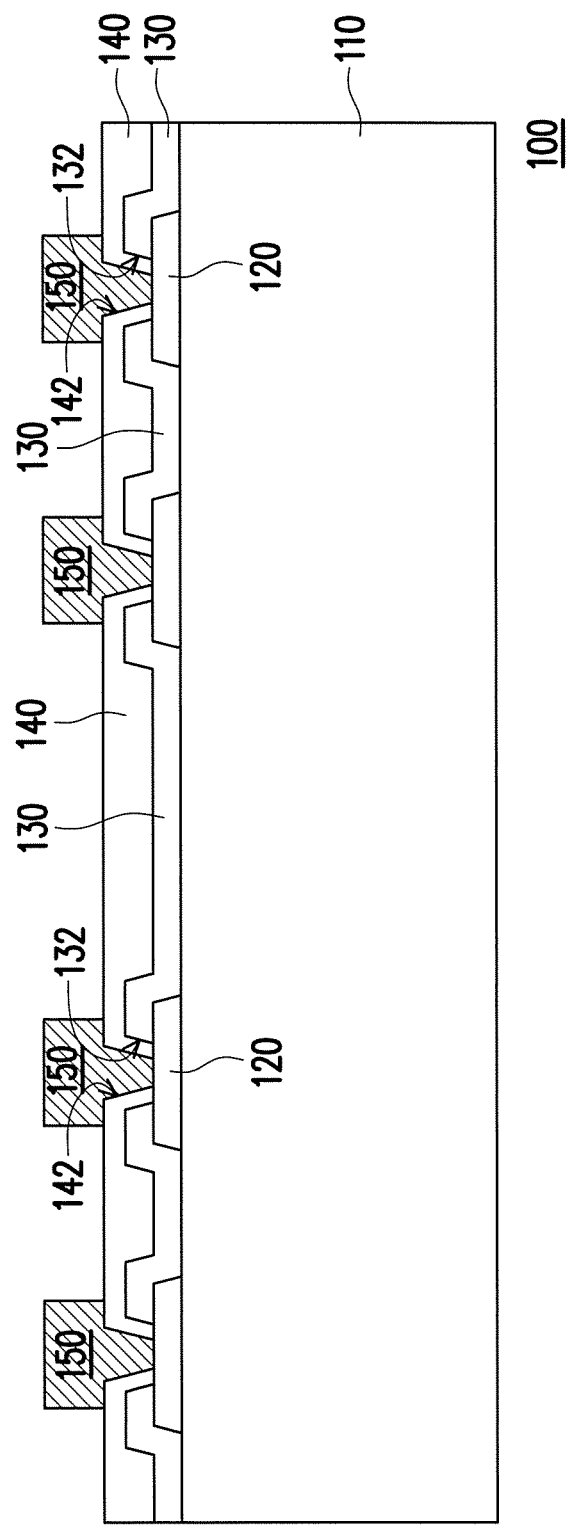

Referring to FIG. 2, a plurality of conductive pillars 150 are formed on the conductive pads 120 of the wafer 100. In some embodiments, the conductive pillars 150 are formed on the conductive pads 120 by a plating process of a conductive material. The plating process of conductive pillars 150 is described in detail as followings. First, a seed layer is deposited (e.g., by sputtering) onto the post-passivation layer 140 and the conductive pads 120 exposed by the contact openings 142. A patterned photoresist layer (not shown) having a predetermined pattern is then formed over the seed layer by spin coating of a photoresist material layer, baking of the photoresist material layer, and photolithography (i.e., exposure and development processes). Portions of the seed layer that are corresponding to the conductive pads 120 are exposed by the patterned photoresist layer. The wafer 100 including the patterned photoresist layer formed thereon is then immersed into a plating bath such that the conductive pillars 150 are plated on the portions of the seed layer that are corresponding to the conductive pads 120 and revealed by the patterned photoresist layer. After the conductive pillars 150 are formed, the patterned photoresist layer is stripped by, for example, etching, ash or other suitable removal processes. Thereafter, by using the conductive pillars 150 as a hard mask, another portions of the seed layer that are not covered by the conductive pillars 150 are removed through etching until the post passivation layer 140 is exposed, for example.

In some embodiments, the conductive pillars 150 are plated copper pillars or other suitable metallic pillars. In some alternative embodiments, the conductive pillars 150 are copper pillars or other suitable metallic pillars which are covered by solder caps (e.g., lead-free solder caps).

Figure 3:
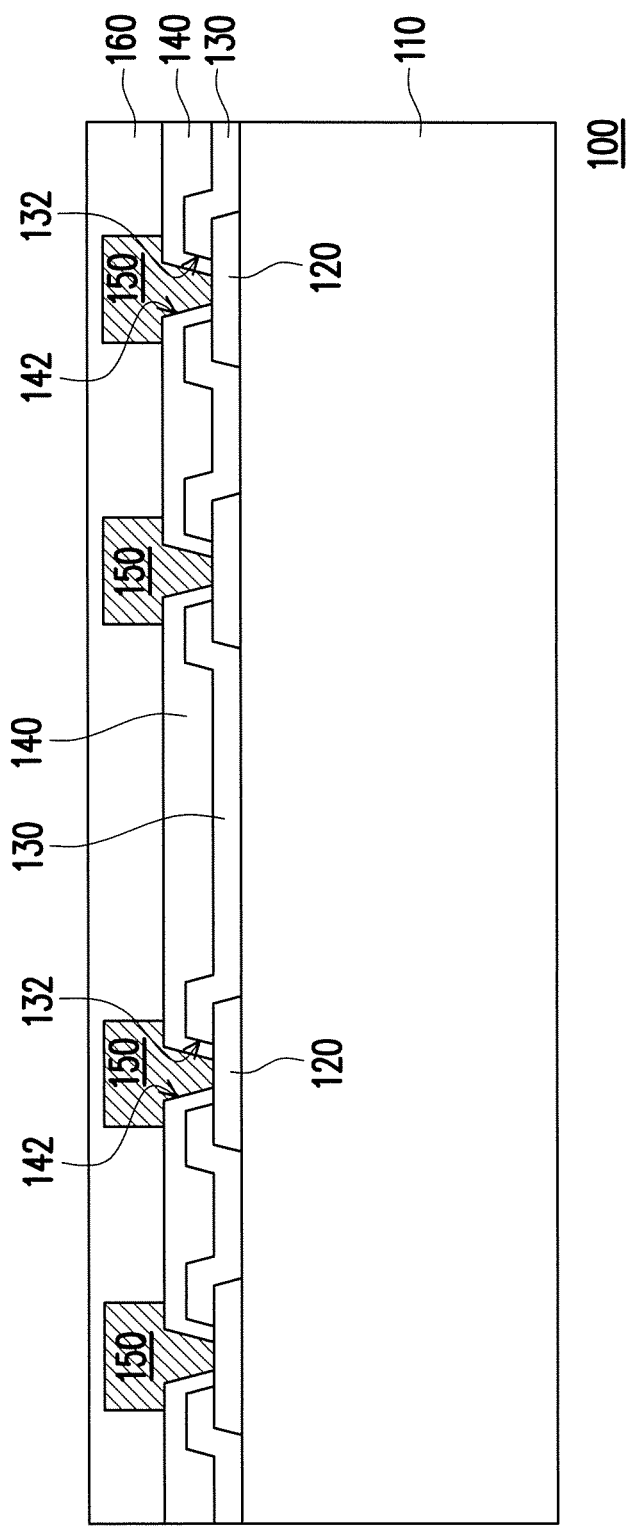

Referring to FIG. 3, after forming the conductive pillars 150, a protection layer 160 is formed on the post passivation layer 140 of the wafer 100 such that the conductive pillars 150 are covered by the protection layer 160. In some embodiments, the protection layer 160 may be a polymer layer having sufficient thickness to encapsulate and protect the conductive pillars 150. In some embodiments, the protection layer 160 may be a polybenzoxazole (PBO) layer, a polyimide (PI) layer or other suitable polymer layer. In some alternative embodiments, the protection layer 160 may be made of inorganic materials. As shown in FIG. 3, the protection layer 160 has a substantially planar top surface and a maximum thickness of the protection layer 160 is greater than a height of the conductive pillars 150.

Figure 4:
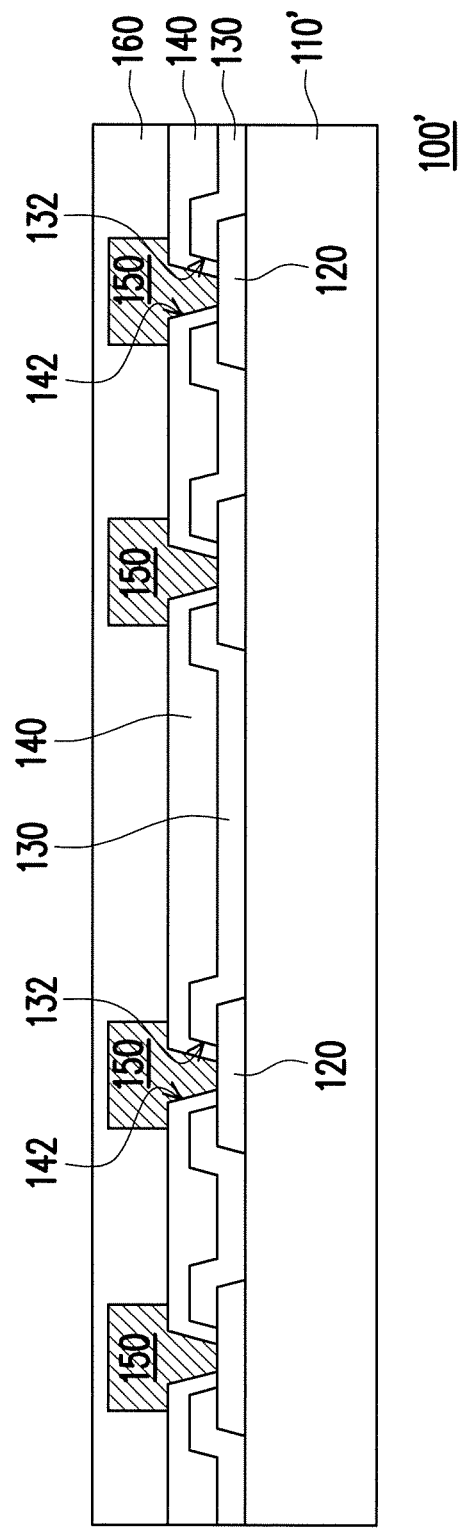

Referring to FIG. 4, after forming the protection layer 160, a back side grinding process may be optionally performed on the back surface of the wafer 100. During the back side grinding process, the semiconductor substrate 110 is partially grinded such that a thinned wafer 100' including a thinned semiconductor substrate 110' is formed. In some embodiments, the back surface of the wafer 100 may be grinded by mechanical grinding or other suitable grinding or polishing processes.

Figure 5:
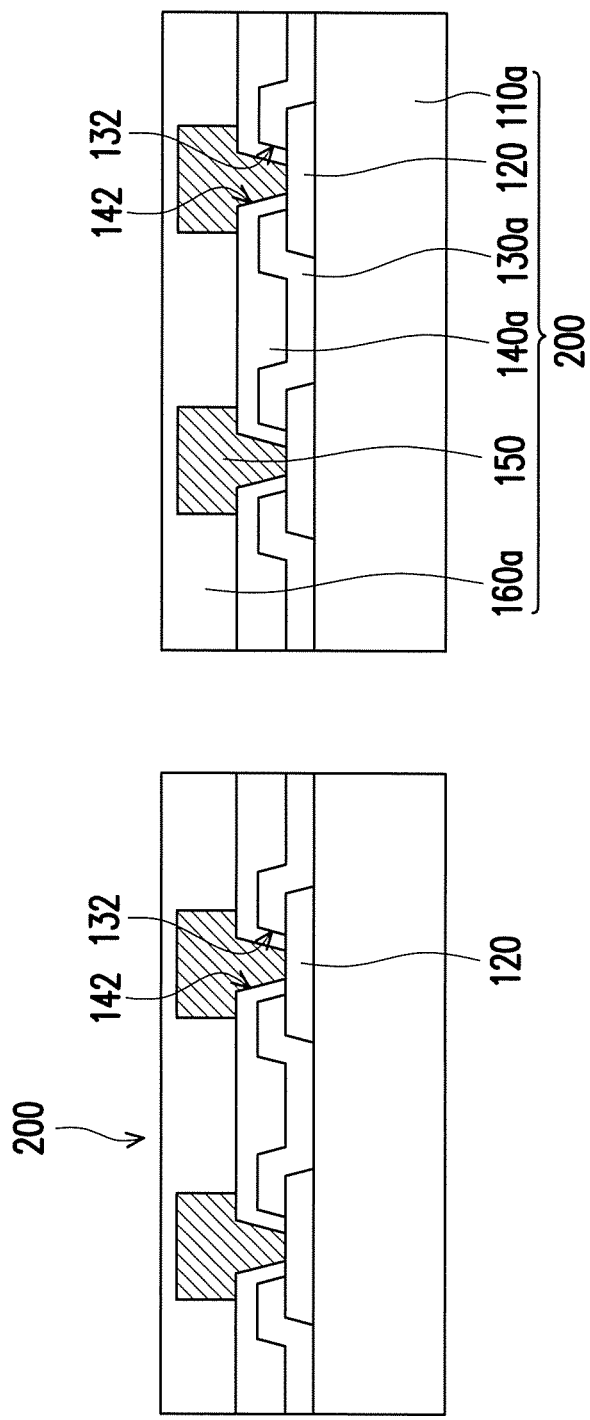

Referring to FIG. 5, after performing the back side grinding process, a wafer dicing process is performed on the thinned wafer 100' such that the integrated circuits 200 in the thinned wafer 100' are singulated from one another. Each one of the singulated integrated circuits 200 may include a semiconductor substrate 110a, the conductive pads 120 formed on the semiconductor substrate 110a, a passivation layer 130a, a post passivation layer 140a, the conductive pillars 150, and a protection layer 160a. As shown in FIG. 4 and FIG. 5, the materials and the characteristics of the semiconductor substrate 110a, the passivation layer 130a, the post passivation layer 140a, and the protection layer 160a are the same as those of the semiconductor substrate 100, the passivation layer 130, the post passivation layer 140, and the protection layer 160. Thus, the detailed descriptions of the semiconductor substrate 110a, the passivation layer 130a, the post passivation layer 140a, and the protection layer 160a are omitted herein for the sake of brevity.

As shown in FIG. 4 and FIG. 5, during the back side grinding process and the wafer dicing process, the protection layer 160 and 160a may well protect the conductive pillars 150 of the integrated circuits 200. In addition, the conductive pillars 150 of the integrated circuits 200 may be protected from being damaged by sequentially performed processes, such as the pick-up and placing process of the integrated circuits 200, the molding process, and so on.

Figure 6:
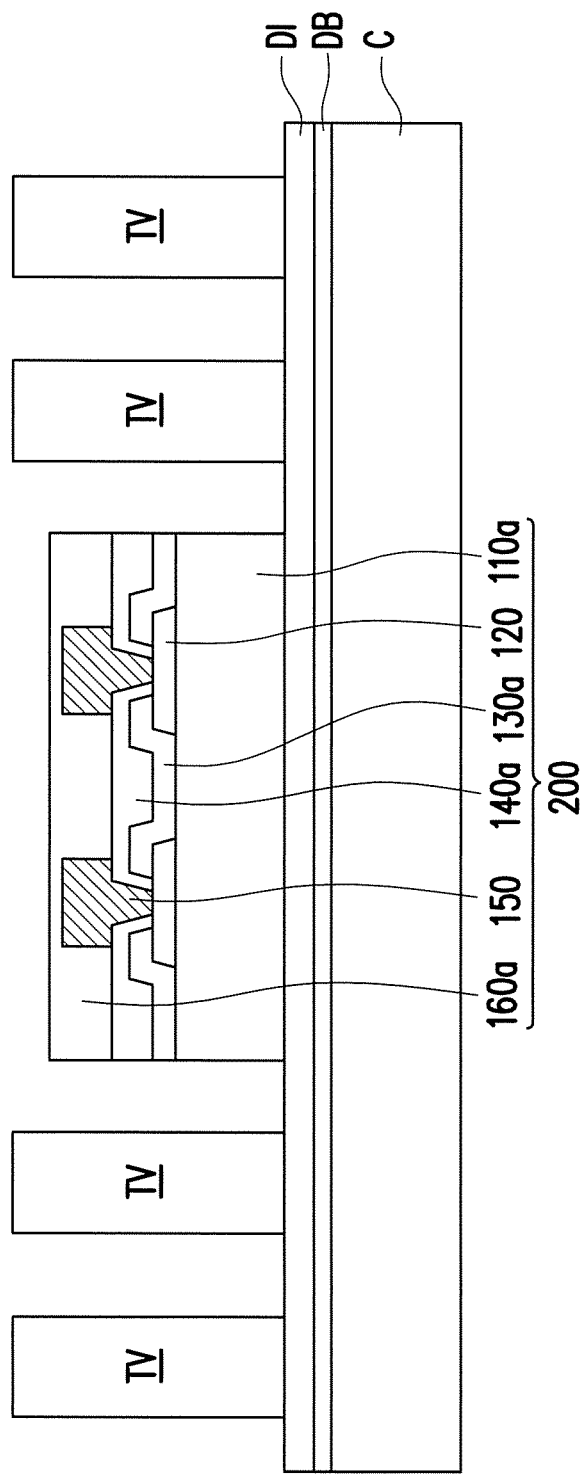

Referring to FIG. 6, after the integrated circuits 200 are singulated from the thinned wafer 100' (shown in FIG. 4), a carrier C having a de-bonding layer DB and a dielectric layer DI formed thereon is provided, wherein the de-bonding layer DB is between the carrier C and the dielectric layer DI. In some embodiments, the carrier C may be a glass substrate, the de-bonding layer DB may be a light-to-heat conversion (LTHC) release layer formed on the glass substrate, and the dielectric layer DI may be a polybenzoxazole (PBO) layer formed on the de-bonding layer DB.

After the carrier C having the de-bonding layer DB and the dielectric layer DI formed thereon is provided, a plurality of conductive through vias TV are formed on the dielectric layer DI. In some embodiments, the plurality of conductive through vias TV is formed by spin coating of a photoresist material layer, baking of the photoresist material layer, photolithography (i.e., exposure and development processes), plating (e.g., electro-plating or electro-less plating), and photoresist stripping processes. For example, the conductive through vias TV include copper posts or other suitable metallic posts.

In some embodiments, before the formation of the conductive through vias TV, a back side redistribution circuit structure (not shown) may be formed on the dielectric layer DI carried by the carrier C, and the conductive through vias TV may be formed on and electrically connected to the back side redistribution circuit structure.

As shown in FIG. 6, in some embodiments, one of the integrated circuits 200 including the conductive pads 120, the conductive pillars 150, and a protection layer 160a formed thereon is picked and placed on the dielectric layer DI carried by the carrier C. The integrated circuits 200 is attached or adhered on the dielectric layer DI through a die attach film (DAF, not shown in the drawings), an adhesion paste or the like. In some alternative embodiments, two or more of the integrated circuits 200 are picked and placed on the dielectric layer DI carried by the carrier C, wherein the integrated circuits 200 placed on the dielectric layer DI may be arranged in an array. In some embodiments, when the integrated circuits 200 placed on the dielectric layer DI are arranged in an array, the conductive through vias TV may be classified into groups. The number of the integrated circuits 200 is corresponding to the number of the groups of the conductive through vias TV.

As shown in FIG. 6, the top surface of the protection layer 160a is lower than the top surfaces of the conductive through vias TV. However, the disclosure is not limited thereto. In some alternative embodiments, the top surface of the protection layer 160a may be substantially aligned with the top surfaces of the conductive through vias TV. In yet some alternative embodiments, the top surface of the protection layer 160a may be higher than the top surfaces of the conductive through vias TV and the top surfaces of the conductive pillars 150 may be lower than, higher than or substantially aligned with the top surfaces of the conductive through vias TV.

As shown in FIG. 6, the integrated circuit 200 is picked and placed on the dielectric layer DI after the formation of the conductive through vias TV. However, the disclosure is not limited thereto. In some alternative embodiments, the integrated circuit 200 is picked and placed on the dielectric layer DI before the formation of the conductive through vias TV.

Figure 7:
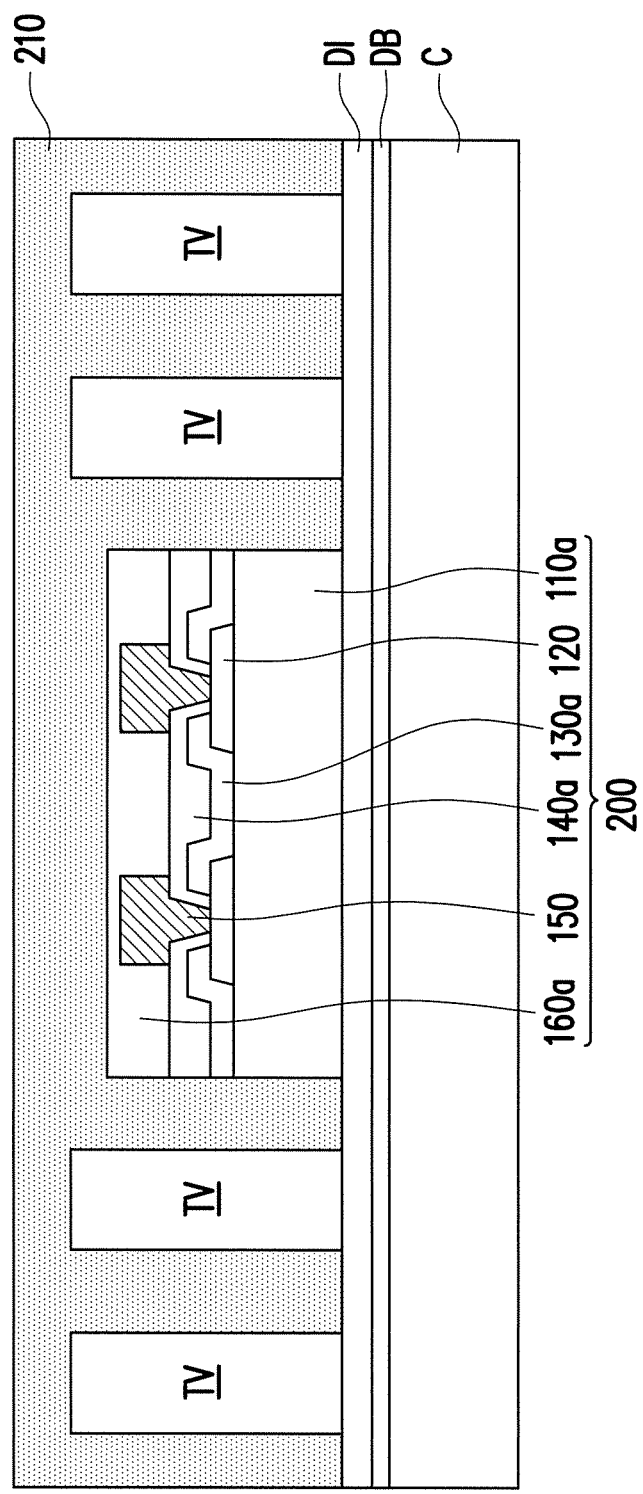

Referring to FIG. 7, an insulating material 210 is formed on the dielectric layer DI to cover the integrated circuit 200 and the conductive through vias TV. In some embodiments, the insulating material 210 is a molding compound formed by a molding process. The conductive pillars 150 and the protection layer 160a of the integrated circuit 200 are covered by the insulating material 210. In other words, the conductive pillars 150 and the protection layer 160a of the integrated circuit 200 are not revealed and are well protected by the insulating material 210. In some embodiments, the insulating material 210 includes epoxy resin or other suitable dielectric materials.

Figure 8:
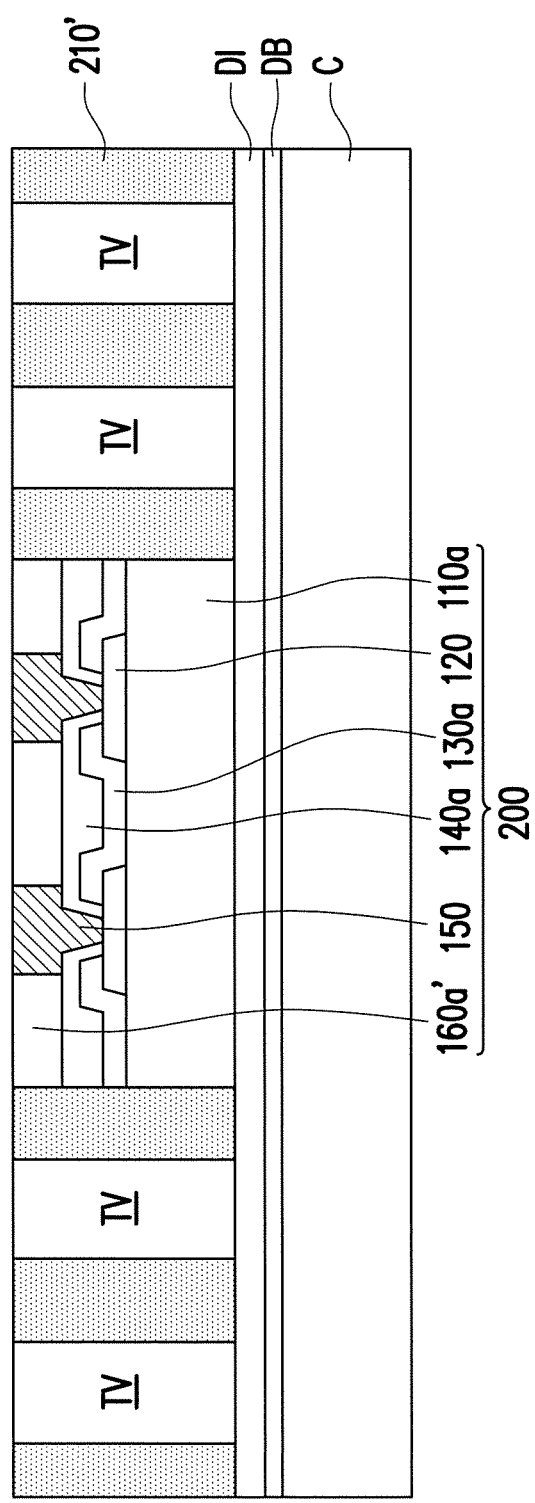

Referring to FIG. 8, the insulating material 210 is then grinded until the top surfaces of the conductive pillars 150, the top surfaces of the conductive through vias TV, and the top surface of the protection layer 160a are exposed. In some embodiments, the insulating material 210 is grinded by a mechanical grinding process and/or a chemical mechanical polishing (CMP) process. After the insulating material 210 is grinded, an insulating encapsulation 210' is formed over the dielectric layer DI. During the grinding process of the insulating material 210, portions of the protection layer 160a are grinded to form a protection layer 160a'. In some embodiments, during the grinding process of the insulating material 210 and the protection layer 160a, portions of the conductive through vias TV and portions of the conductive pillars 150 are slightly grinded also.

As shown in FIG. 8, the insulating encapsulation 210' laterally encapsulates sidewalls of the integrated circuit 200 and the insulating encapsulation 210' is penetrated by the conductive through vias TV. In other words, the integrated circuit 200 and the conductive through vias TV are embedded in the insulating encapsulation 210'. It is noted that the top surfaces of the conductive through vias TV, the top surface of the insulating encapsulation 210', and the top surfaces of the conductive pillars 150 are substantially coplanar with the top surface of the protection layer 160a'.

Figure 9:
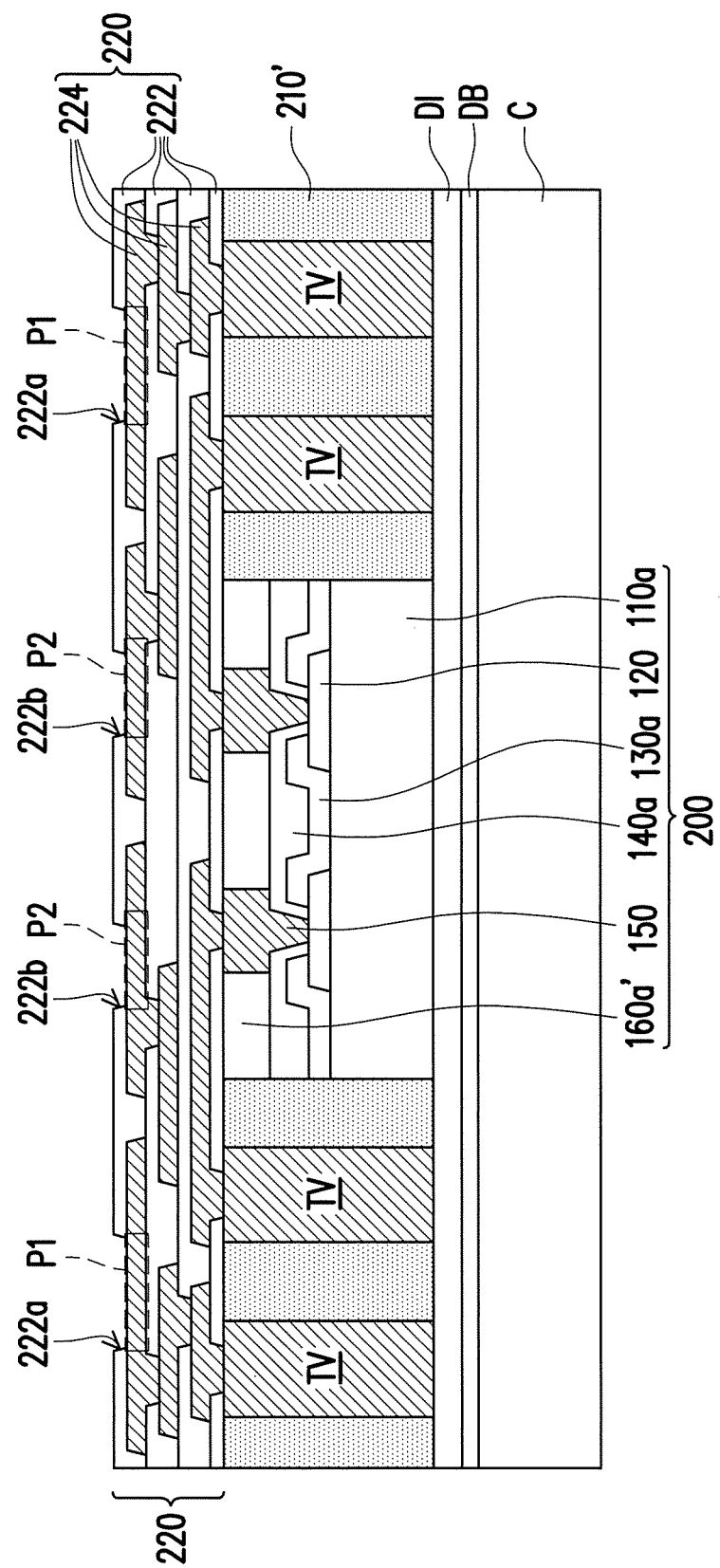

Referring to FIG. 9, after forming the insulating encapsulation 210' and the protection layer 160a', a front side redistribution circuit structure 220 electrically connected to the conductive pillars 150 of the integrated circuit 200 and the conductive through vias TV is formed on the top surfaces of the conductive through vias TV, the top surface of the insulating encapsulation 210', the top surfaces of the conductive pillars 150, and the top surface of the protection layer 160a'. The front side redistribution circuit structure 220 is fabricated to electrically connect with one or more connectors underneath. Here, the afore-said connectors may be the above-mentioned back side redistribution circuit structure, the conductive pillars 150 of the integrated circuit 200 and/or the conductive through vias TV embedded in the insulating encapsulation 210'. The front side redistribution circuit structure 220 is described in accompany with FIG. 9 in detail.

Referring to FIG. 9, the front side redistribution circuit structure 220 includes a plurality of inter-dielectric layers 222 and a plurality of redistribution conductive layers 224 stacked alternately, and the redistribution conductive layers 224 are electrically connected to the conductive pillars 150 of the integrated circuit 200 and the conductive through vias TV embedded in the insulating encapsulation 210'. The top surfaces of the conductive pillars 150 and the top surfaces of the conductive through vias TV are partially covered by a bottommost one of the inter-dielectric layers 222. A topmost one of the redistribution conductive layers 224 is partially covered by a topmost one of the inter-dielectric layers 222, wherein the topmost one of the redistribution conductive layers 224 includes a plurality of ball pads P1 and the topmost one of the inter-dielectric layers 222 includes a plurality of contact openings 222a corresponding to the ball pads P1.

Figure 10:
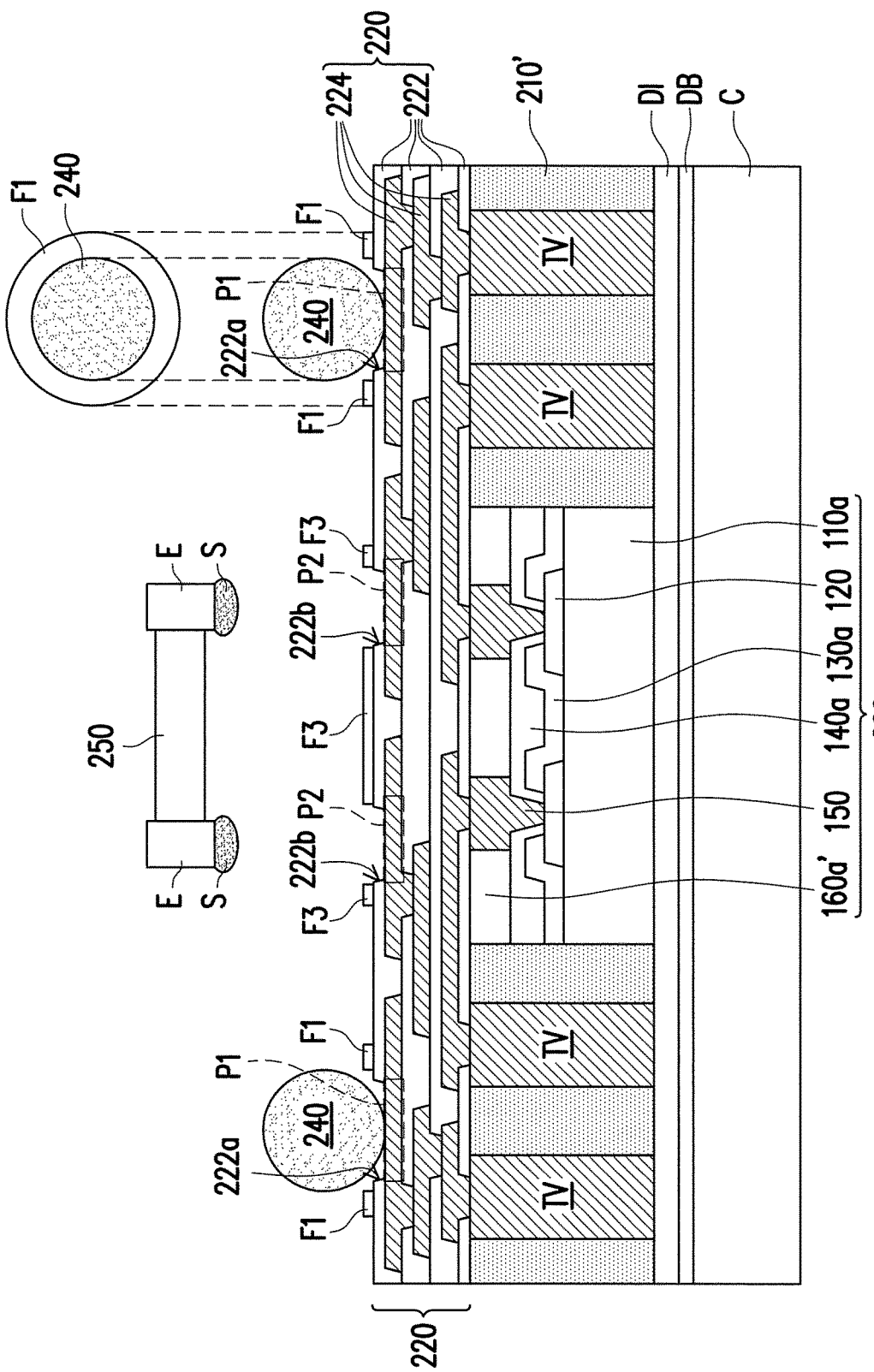

Referring to FIG. 10, after forming the front side redistribution circuit structure 220, a ball placement process is performed. Before performing the ball placement process, no under-ball metallurgy is required to be formed on the ball pads P1 in advance. Accordingly, complexity and fabrication cost of integrated fan-out packages may be reduced. The ball placement process is described in detail as followings.

The ball placement process may include the following steps. A flux material F1 is formed on the front side redistribution circuit structure 220, and a plurality of conductive balls 240 (e.g., solder balls) are then placed on the ball pads P1. In some embodiments, the flux material F1 may be formed before placing the conductive balls 240 on the ball pads P1. In some alternative embodiments, the flux material F1 may be formed after placing the conductive balls 240 on the ball pads P1. As shown in FIG. 10, the flux material F1 is formed on a top surface of the topmost one of the redistribution conductive layers 224 and is distributed around the ball pads P1; the flux material F1 may be distributed outside the contact openings 222a and the flux material F1 may be formed on the front side redistribution circuit structure 220 by a flux dispensing process, a flux printing process or other suitable process; and the position of the conductive balls 240 may be confined by the contact opening 222a. In some embodiments, the flux material F1 may be a nitride-free epoxy based flux paste and an amount of solid in the flux material F1 may range from about 10% to about 50%. For example, the flux material F1 may be an epoxy based flux including phenol, anhydride resin and so on. In some alternative embodiments, the flux material F1 may be a liquid type nitride-free epoxy based flux and an amount of solid in the flux material F1 may range from about 10% to about 50%.

In some alternative embodiments, the topmost one of the redistribution conductive layers 224 may further include a plurality of connection pads P2, the topmost one of the inter-dielectric layers 222 may further include a plurality of contact openings 222b corresponding to the connection pads P2, and another flux material F3 may be formed on the front side redistribution circuit structure 220 and distributed around the contact openings 222b. For example, the flux material F1 and the flux material F3 are the same material and may be formed a same process. As shown in FIG. 10, at least one surface mount device 250 (e.g., passive component) is provided on the connection pads P2. The surface mount device 250 includes electrodes E and a solder material S formed on the electrodes E of the surface mount device 250, for example.

Figure 11:
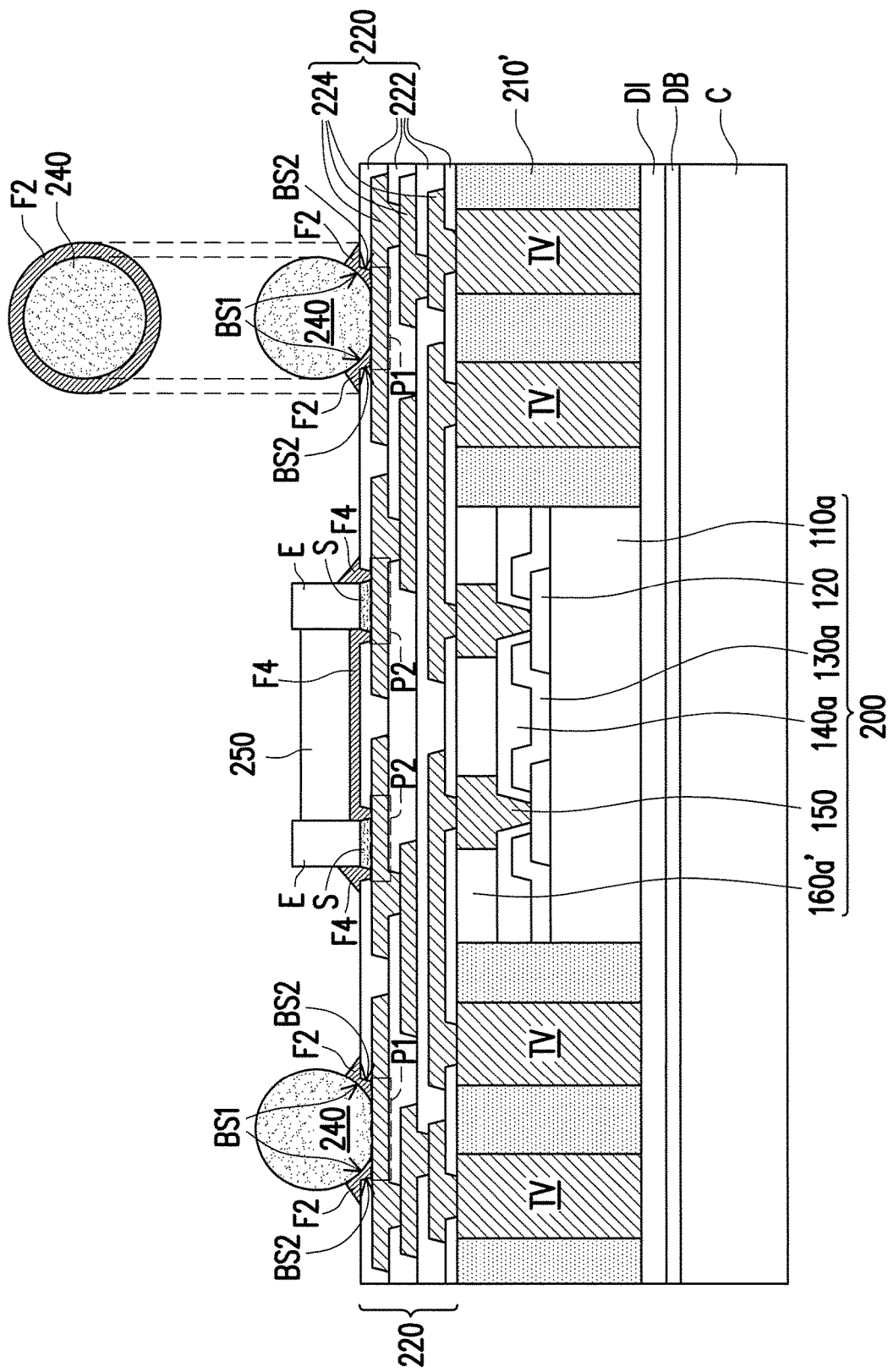

Referring to FIG. 11, a thermal process or a reflow process is performed to heat the flux material F1 and the conductive balls 240 such that the conductive balls 240 are bonded with the ball pads P1. During the above-mentioned thermal process or reflow process, the flux material F1 is heated and serves as a chemical cleaning agent, flowing agent, and/or a purifying agent so as to facilitate metallurgical bonding between the conductive balls 240 and the ball pads P1. Furthermore, the thermal process is performed to heat the flux material F3 and the solder material S such that the electrodes E of the surface mount device 250 are bonded with the connection pads P2 through the solder material S. During the above-mentioned thermal process, the flux material F3 is heated and serves as a chemical cleaning agent, flowing agent, and/or a purifying agent so as to facilitate metallurgical bonding between the solder material S and the connection pads P2.

After performing the above-mentioned thermal process or reflow process, the flux material F1 is converted into a plurality of ring-shaped flux structures F2 and the flux material F3 is converted into a flux structure F4. As shown in FIG. 11, an outer profile of each of the ring-shaped flux structures F2 may be circular. However, the outer profile of each of the ring-shaped flux structures F2 is not limited thereto. Although the ring-shaped flux structures F2 are made from the flux material F1, the composition of the ring-shaped flux structures F2 is different from that of the flux material F1. In some embodiments, a material of the ring-shaped flux structures F2 includes nitride-free epoxy based flux (e.g., Phenolic resins); a glass transition temperature (Tg) of the epoxy based flux may range from about 60 Celsius degrees to about 180 Celsius degrees; and/or a Young's modulus of the epoxy based flux may range from about 4 GPa to about 10 GPa. In such embodiments, the coefficient of thermal expansion ($\alpha 1$-CTE) of the epoxy based flux which is measured under a first temperature lower than the glass transition temperature (Tg) may range from about 30 to about 60 while the coefficient of thermal expansion ($\alpha 2$-CTE) of the epoxy based flux which is measured under a second temperature higher than the glass transition temperature (Tg) may range from about 100 to about 160.

As shown in FIG. 11, after performing the ball placement process, a plurality of conductive terminals bonded with the ball pads P1 are formed. Each of the conductive terminals includes the conductive ball 240 and one of the ring-shaped flux structures F2, wherein each of the ring-shaped flux structures F2 is disposed around and in contact with a bottom portion of the conductive ball 240, respectively. In some embodiments, each of the ring-shaped flux structures F2 fills and a space between the bottom portion of the corresponding conductive ball 240 and the front side redistribution circuit structure 220, wherein each of the ring-shaped flux structures F2 includes a first bonding surface BS1 in contact with the bottom portion of the corresponding conductive ball 240 and a second bonding surface BS2 in contact with the front side redistribution circuit structure 220. For example, each of the ring-shaped flux structures F2 may extend into one of the contact openings 222a (shown in FIG. 10), correspondingly. Since each of the ring-shaped flux structures F2 fills the space between the bottom portion of the corresponding conductive ball 240 and the front side redistribution circuit structure 220, bonding reliability of the conductive balls 240 may be enhanced and delamination between the topmost one of the redistribution conductive layers 224 and the topmost one of the inter-dielectric layers 222 may be prevented.

As shown in FIG. 11, the flux structure F4 encapsulates the solder material S and partially covers the electrodes E of the surface mount device 250.

In some embodiments, the ring-shaped flux structures F2 may be referred as to residue of the flux material F1 and the ring-shaped flux structures F2 are formed by reaction of the flux material F1 and the conductive balls 240 during the thermal process. The flux structure F4 may be referred as to residue of the flux material F3 and the ring-shaped flux structure F4 is formed by reaction of the flux material F3 and the solder material S during the thermal process.

Figure 12:
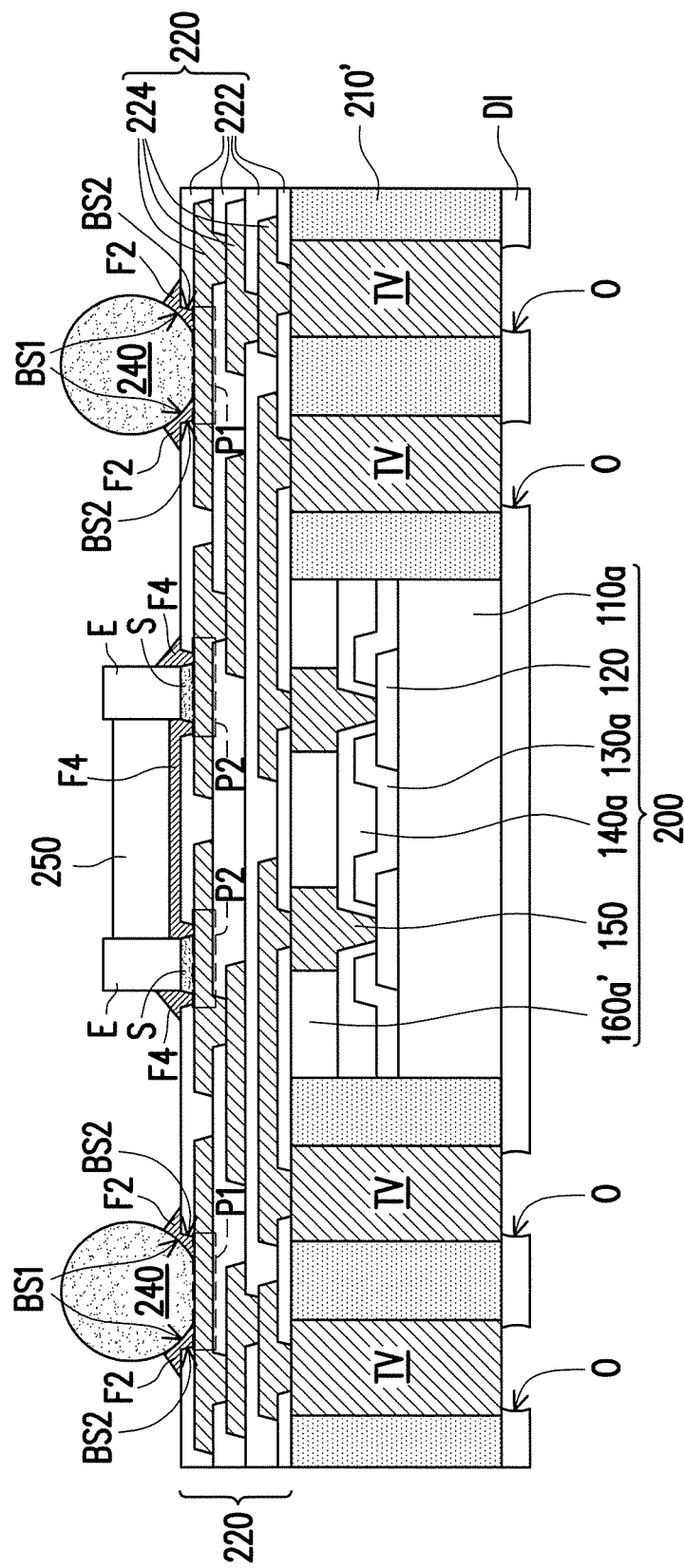

Referring to FIG. 11 and FIG. 12, after the conductive balls 240 and the surface mount device 250 are mounted on the front side redistribution circuit structure 220, the resulted product formed on the dielectric layer DI is de-bonded from the de-bonding layer DB such the resulted product and the dielectric layer DI is separated from the carrier C. In some embodiments, the de-bonding layer DB (e.g., the LTHC release layer) may be irradiated by an UV laser such that the dielectric layer DI is peeled from the carrier C.

As shown in FIG. 12, the dielectric layer DI is then patterned such that a plurality of contact openings O may be formed to expose the bottom surfaces of the conductive through vias TV. The number and position of the contact openings O are corresponding to the number of the conductive through vias TV. In some embodiments, the contact openings O of the dielectric layer DI are formed by a laser drilling process or other suitable patterning processes.

Referring to FIG. 13, after the contact openings O are formed in the dielectric layer DI, a plurality of conductive balls 260 are placed on the bottom surfaces of the conductive through vias TV that are exposed by the contact openings O. And, the conductive balls 260 are, for example, reflowed to bond with the bottom surfaces of the conductive through vias TV. As shown in FIG. 13, after the conductive balls 240 and the conductive balls 260 are formed, an integrated fan-out package of the integrated circuit 200 having dual-side terminal design (i.e. the conductive balls 240 and 260) is accomplished.

Referring to FIG. 14, another semiconductor device 300 (e.g., a surface mount type package) is then provided. In some embodiments, the semiconductor device 300 is, for example, a memory device or other suitable semiconductor devices. The semiconductor device 300 is stacked over and is electrically connected to the integrated fan-out package illustrated in FIG. 12 through the conductive balls 260 such that a package-on-package (POP) structure is accomplished.

In the above-mentioned embodiments, the ring-shaped flux structures F2 and the flux structure F4 enhance the bonding strength between the conductive balls 240 and the ball pads P1. Accordingly, the reliability of the integrated fan-out package is enhanced.

In accordance with some embodiments of the present disclosure, an integrated fan-out package including an integrated circuit component, an insulating encapsulation, a redistribution circuit structure and a plurality of conductive terminals is provided. The insulating encapsulation laterally encapsulates sidewalls of the integrated circuit component. The redistribution circuit structure is disposed on the insulating encapsulation and the integrated circuit component. The redistribution circuit structure is electrically connected to the integrated circuit component and the redistribution circuit structure includes a plurality of ball pads. Each of the conductive terminals includes a conductive ball and a ring-shaped flux structure, wherein each of the conductive balls is disposed on and electrically connected to one of the ball pads. Each of the ring-shaped flux structures is disposed on the redistribution circuit structure. Each of the ring-shaped flux structure is disposed around and in contact with a bottom portion of the conductive ball.

In accordance with alternative embodiments of the present disclosure, an integrated fan-out package including an integrated circuit component, an insulating encapsulation, a redistribution circuit structure and a plurality of conductive terminals is provided. The insulating encapsulation laterally encapsulates sidewalls of the integrated circuit component. The redistribution circuit structure is disposed on the insulating encapsulation and the integrated circuit component. The redistribution circuit structure is electrically connected to the integrated circuit component. The redistribution circuit structure includes a plurality of redistribution conductive layers and a plurality of inter-dielectric layers stacked alternately, a topmost one of the redistribution conductive layers is covered by a topmost one of the inter-dielectric layers, the topmost one of the redistribution conductive layers includes a plurality of ball pads, and the topmost one of the inter-dielectric layers includes a plurality of contact openings corresponding to the ball pads. Each of the conductive terminals includes a conductive ball a ring-shaped flux structure. Each of the conductive balls is disposed on and electrically connected to one of the ball pads. Each of the ring-shaped flux structures is disposed around a bottom portion of the conductive ball. Each of the ring-shaped flux structures fills a space between the bottom portion of the conductive ball and the redistribution circuit structure. Each of the ring-shaped flux structure includes a first bonding surface in contact with the bottom portion of the conductive ball and a second bonding surface in contact with the redistribution circuit structure.

In accordance with yet alternative embodiments of the present disclosure, a method of fabricating an integrated fan-out package is provided. The method includes the following steps. An integrated circuit component is provided on a carrier. An insulating encapsulation is formed on the carrier to encapsulate sidewalls of the integrated circuit component. A redistribution circuit structure is formed on the integrated circuit component and the insulating encapsulation, wherein the redistribution circuit structure is electrically connected to the integrated circuit component and the redistribution circuit structure includes a plurality of ball pads. A flux material is formed on the redistribution circuit structure, wherein the flux material is formed around the ball pads. A plurality of conductive balls are placed on the ball pads. The conductive balls are bonded with the ball pads by performing a reflow process so as to formed a plurality of ring-shaped flux structures from the flux material, wherein the ring-shaped flux structures are disposed on the redistribution circuit structure, each of the ring-shaped flux structures is disposed around and in contact with a bottom portion of one of the conductive balls respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated fan-out package, comprising:
    an integrated circuit component;
    an insulating encapsulation laterally encapsulating the integrated circuit component;
    a redistribution circuit structure disposed on the insulating encapsulation and the integrated circuit component, the redistribution circuit structure being electrically connected to the integrated circuit component, the redistribution circuit structure comprising a plurality of ball pads;
    a plurality of conductive terminals in contact with the ball pads of the redistribution circuit structure, each of the conductive terminals comprising:
        a conductive ball disposed on and in contact with one of the ball pads; and
        a ring-shaped flux structure in contact with one of the ball pads of the redistribution circuit structure, wherein the ring-shaped flux structure is disposed around and in contact with a bottom portion of the conductive ball.

2. The integrated fan-out package of claim 1, wherein the redistribution circuit structure comprises a plurality of redistribution conductive layers and a plurality of inter-dielectric layers stacked alternately, a topmost one of the inter-dielectric layers comprises a plurality of contact openings corresponding to the ball pads, the ring-shaped flux structures of the conductive terminals are disposed on and in contact with the topmost one of the inter-dielectric layers.

3. The integrated fan-out package of claim 1, wherein a material of the conductive balls comprise solder.

4. The integrated fan-out package of claim 1, wherein a material of the ring-shaped flux structure comprises nitride-free epoxy based flux.

5. The integrated fan-out package of claim 4, wherein a glass transition temperature ($T_g$) of the epoxy based flux ranges from about 60 Celsius degrees to about 180 Celsius degrees.

6. The integrated fan-out package of claim 4, wherein a Young's modulus of the epoxy based flux ranges from about 4 GPa to about 10 GPa.

7. The integrated fan-out package of claim 4, wherein a first coefficient of thermal expansion ($\alpha 1$-CTE) of the epoxy based flux ranges from about 30 to about 60, a second first coefficient of thermal expansion ($\alpha 2$-CTE) of the epoxy based flux ranges from 100 to 180, the first coefficient of thermal expansion ($\alpha 1$-CTE) is measured under a temperature lower than the glass transition temperature, and the second coefficient of thermal expansion ($\alpha 2$-CTE) is measured under a temperature higher than the glass transition temperature.

8. An integrated fan-out package, comprising:
    an integrated circuit component;
    an insulating encapsulation laterally encapsulating sidewalls of the integrated circuit component;
    a redistribution circuit structure disposed on the insulating encapsulation and the integrated circuit component, the redistribution circuit structure being electrically connected to the integrated circuit component, the redistribution circuit structure comprising a plurality of redistribution conductive layers and a plurality of inter-dielectric layers stacked alternately, a topmost one of the redistribution conductive layers comprising a plurality of ball pads and being covered by a topmost one of the inter-dielectric layers, and the topmost one of the inter-dielectric layers comprising a plurality of contact openings corresponding to the ball pads;
    a plurality of conductive terminals in contact with the ball pads of the redistribution circuit structure, each of the conductive terminals comprising:
        a conductive ball disposed on and in contact with one of the ball pads; and
        a ring-shaped flux structure disposed around a bottom portion of the conductive ball, the ring-shaped flux structure being in contact with one of the ball pads, the ring-shaped flux structure filling a space between the bottom portion of the conductive ball and the redistribution circuit structure, wherein the ring-shaped flux structure comprises a first bonding surface in contact with the bottom portion of the conductive ball and a second bonding surface in contact with the redistribution circuit structure.

9. The integrated fan-out package of claim 8, wherein the ring-shaped flux structures are in contact with the topmost one of the inter-dielectric layers and extending into the contact openings.

10. The integrated fan-out package of claim 8, wherein a material of the conductive balls comprise solder.

11. The integrated fan-out package of claim 8, wherein a material of the ring-shaped flux structure comprises nitride-free epoxy based flux.

12. The integrated fan-out package of claim 11, wherein a glass transition temperature (Tg) of the epoxy based flux ranges from about 60 Celsius degrees to about 180 Celsius degrees.

13. The integrated fan-out package of claim 11, wherein a Young's modulus of the epoxy based flux ranges from about 4 GPa to about 10 GPa.

14. The integrated fan-out package of claim 11, wherein a first coefficient of thermal expansion ($\alpha1$-CTE) of the epoxy based flux ranges from about 30 to about 60, a second first coefficient of thermal expansion ($\alpha2$-CTE) of the epoxy based flux ranges from 100 to 180, the first coefficient of thermal expansion ($\alpha1$-CTE) is measured under a temperature lower than the glass transition temperature, and the second coefficient of thermal expansion ($\alpha2$-CTE) is measured under a temperature higher than the glass transition temperature.

15. A method of fabricating an integrated fan-out package, the method comprising:
   providing an integrated circuit component on a carrier;
   forming an insulating encapsulation on the carrier to laterally encapsulate the integrated circuit component;
   forming a redistribution circuit structure on the integrated circuit component and the insulating encapsulation, the redistribution circuit structure being electrically connected to the integrated circuit component, and the redistribution circuit structure comprising a plurality of ball pads;
   forming a flux material on the redistribution circuit structure, the flux material being formed around the ball pads;
   providing a plurality of conductive balls independent from one another and placing the conductive balls on the ball pads of the redistribution circuit structure; and
   performing a reflow process to bond the conductive balls with the ball pads and convert the flux material into a plurality of ring-shaped flux structures, wherein the ring-shaped flux structures are in contact with the ball pads, and each of the ring-shaped flux structures is disposed around and in contact with a bottom portion of one of the conductive balls respectively,
   during the reflow process, the flux material is heated and serves as a chemical cleaning agent, a flowing agent, and/or a purifying agent so as to facilitate bonding between the conductive balls and the ball pads.

16. The method of claim 15, wherein the flux material comprises a nitride-free epoxy based flux and an amount of solid in the flux material ranges from about 10% to about 50%.

17. The method of claim 15, wherein a material of the ring-shaped flux structure comprises nitride-free epoxy based flux.

18. The method of claim 15, wherein a glass transition temperature (Tg) of the epoxy based flux ranges from about 60 Celsius degrees to about 180 Celsius degrees.

19. The method of claim 15, wherein a Young's modulus of the epoxy based flux ranges from about 4 GPa to about 10 GPa.

20. The method of claim 15, wherein a first coefficient of thermal expansion ($\alpha1$-CTE) of the epoxy based flux ranges from about 30 to about 60, a second first coefficient of thermal expansion ($\alpha2$-CTE) of the epoxy based flux ranges from 100 to 180, the first coefficient of thermal expansion ($\alpha1$-CTE) is measured under a temperature lower than the glass transition temperature, and the second coefficient of thermal expansion ($\alpha2$-CTE) is measured under a temperature higher than the glass transition temperature.

* * * * *